(12) United States Patent
Yang

(10) Patent No.: US 7,256,128 B2
(45) Date of Patent: Aug. 14, 2007

(54) METHOD OF DOUBLE-SIDED ETCHING

(75) Inventor: Chen-Hsiung Yang, Taipei Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 211 days.

(21) Appl. No.: 10/711,883

(22) Filed: Oct. 12, 2004

(65) Prior Publication Data

US 2006/0021965 A1 Feb. 2, 2006

(30) Foreign Application Priority Data

Jul. 30, 2004 (TW) .............................. 93122940 A

(51) Int. Cl.
*H01L 21/311* (2006.01)
(52) U.S. Cl. ..................................... 438/700; 438/719
(58) Field of Classification Search ................ 438/700, 438/702, 694, 706, 708, 709, 714, 719, 723
See application file for complete search history.

(56) References Cited

U.S. PATENT DOCUMENTS

| | | | |
|---|---|---|---|
| 6,458,615 B1 * | 10/2002 | Fedder et al. ................. | 438/50 |
| 6,541,831 B2 * | 4/2003 | Lee et al. .................... | 257/415 |
| 6,794,217 B2 * | 9/2004 | Lee et al. ..................... | 438/72 |
| 6,818,464 B2 * | 11/2004 | Heschel ....................... | 438/22 |
| 2005/0142688 A1 * | 6/2005 | Partridge et al. ............. | 438/53 |
| 2005/0227400 A1 * | 10/2005 | Chase et al. .................. | 438/51 |

* cited by examiner

*Primary Examiner*—Kin-Chan Chen
(74) *Attorney, Agent, or Firm*—Winston Hsu

(57) ABSTRACT

A wafer, having at least a spindle region and at least two through regions alongside the spindle region, is provided. The wafer in the spindle region is partially removed from the bottom surface. Thereafter, the bottom surface is bonded to a carrier with a bonding layer, and the wafer in the through regions is completely removed from the top surface.

10 Claims, 6 Drawing Sheets

METHOD OF DOUBLE-SIDED ETCHING

BACKGROUND OF INVENTION

1. Field of the Invention

The present invention pertains to a method of double-sided etching, and more specifically, to a method of forming a micro spindle by double-sided etching.

2. Description of the Prior Art

Micro electromechanical system (MEMS) technology is an emerging technology which highly integrates electronics and mechanics, and has been broadly adopted to fabricate various devices having electro and mechanical characteristics, such as micro sensors, micro actuators, micro motors, photosensitive switches, etc. MEMS devices generally have mechanical structures more complicated than semiconductor devices, and thus cannot be directly fabricated by standard semiconductor processes. Take the micro spindle, one of the most common structures in MEMS devices, for example, accurate shape and smooth surface condition are strictly required for ensuring reliability and stress-bearing capability.

Please refer to FIG. 1 to FIG. 3. FIG. 1 is a schematic diagram of a micro spindle 10; FIG. 2 and FIG. 3 are schematic diagrams illustrating a conventional method of forming a micro spindle. As shown in FIG. 1, the micro spindle is a suspension structure capable of being driven by a voltage, light beams, or a magnetic field, and thereby rotates in the direction as the arrow indicates shown in FIG. 1. Therefore, the micro spindle 10 must have an accurate shape, a smooth surface, and a uniform axis so as to guarantee reliability and stress-bearing capability. The conventional method of fabricating the spindle 10 is described below.

As shown in FIG. 2, a wafer 20 is provided. Then, an etching stop layer 22 and a photo resist pattern 24 are respectively formed on the bottom surface and the top surface of the wafer 20. As shown in FIG. 3, an etching process is followed to etch through the wafer 20 not covered by the photo resist pattern 24 until the etching stop layer 22.

According to the conventional method, however, equilibrium of the etching process and the thickness uniformity of the wafer 20 are not taken into consideration. Thus, the yield of the etching process cannot be well controlled because etching rates in different regions of the wafer 20 are not equal. For example, on the occasion of etching through the wafer 20, the overall area being etched varies dramatically, and leads to unexpected changes during the etching process. In addition, when the etching process is performed down to the etching stop layer 22, side etching effect tends to occur and therefore results in an undercut 26 as shown in FIG. 3. As mentioned earlier, if the shape accuracy of the micro spindle degrades, reliability of the micro spindle will be seriously affected.

SUMMARY OF INVENTION

It is therefore a primary object of the present invention to a method of double-sided etching to overcome the aforementioned problems.

According to a preferred embodiment of the present invention, a method of forming a micro spindle is disclosed. The method includes the following steps:

providing a wafer comprising at least a spindle region and two through regions, the two through regions being respectively positioned on both sides of the spindle region;

partially removing the wafer in the spindle region from a first surface of the wafer; and removing the wafer in the two through regions from a second surface of the wafer until the wafer is removed through to the first surface.

The method forms the micro spindle by means of double-sided etching, and thus is able to prevent excessive variation in the overall area being etched and prevent the side etching problem while the etching process is performed down to the etching stop layer. Consequently, the reliability and stress-bearing capability of the micro spindle is ensured.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
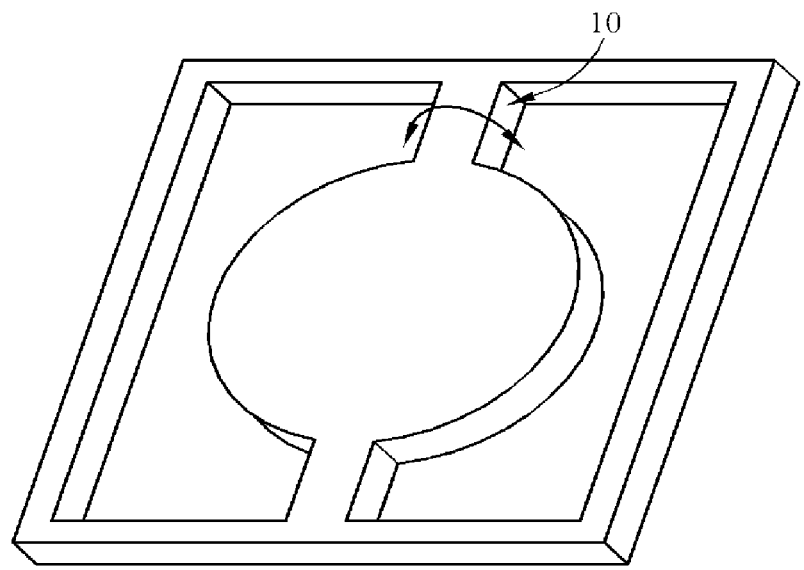
FIG. 1 is a schematic diagram of a micro spindle.
Figure 2:
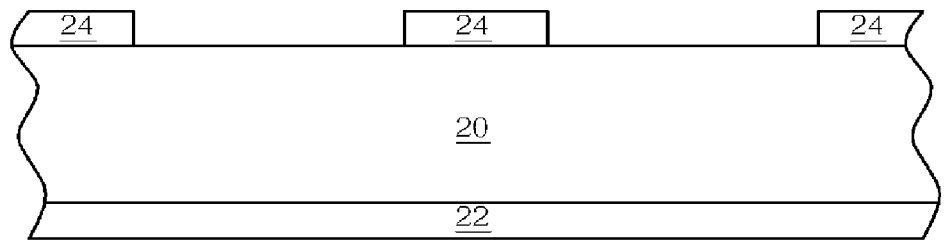
FIG. 2 and FIG. 3 are schematic diagrams illustrating a conventional method of forming a micro spindle.
Figure 3:
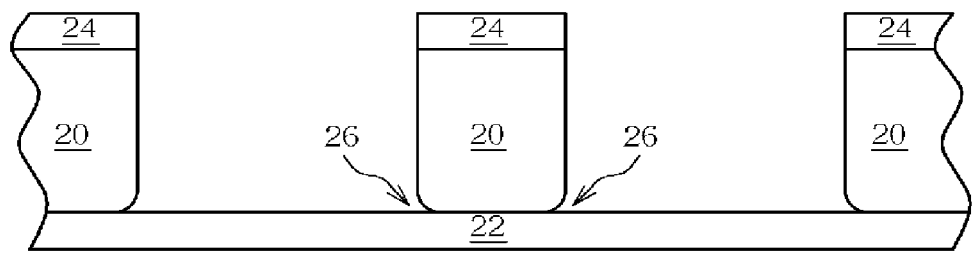
Figure 4:
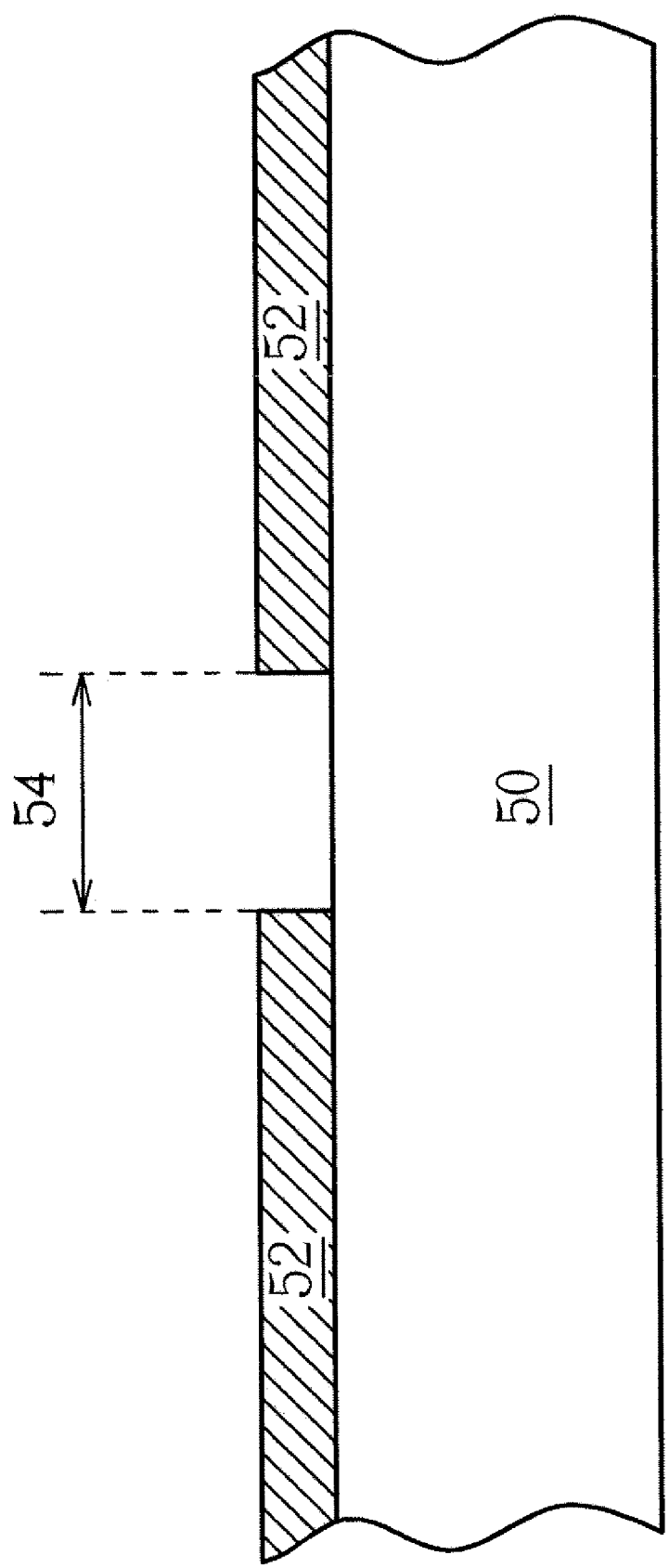
FIG. 4 through FIG. 8 are schematic diagrams illustrating a method of forming a micro spindle according to a preferred embodiment of the present invention.
Figure 5:
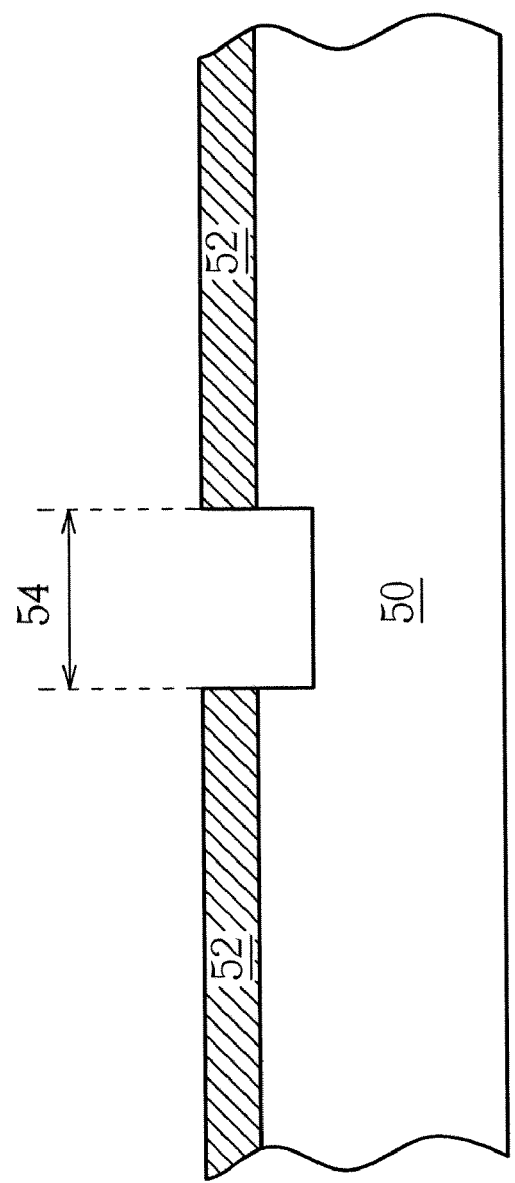

Please refer to FIG. 4 through FIG. 8. FIG. 4 through FIG. 8 are schematic diagrams illustrating a method of forming a micro spindle according to a preferred embodiment of the present invention. As shown in FIG. 4, a wafer 50, such as a silicon wafer, is provided, and a photo resist pattern 52 is formed on the bottom surface of the wafer 50 to define the dimension of a spindle region 54. As shown in FIG. 5, an etching process, such as a reactive ion etching (RIE) process, is performed to etch the wafer 50 unprotected by the photo resist pattern 52 down to a predetermined depth. It is appreciated that the predetermined depth must be greater than the sum of the deviation of the etching process to be performed and the deviation of the thickness of the wafer 50, and therefore the structure of the micro spindle will not be damaged during the etching process to be performed.

Figure 6:
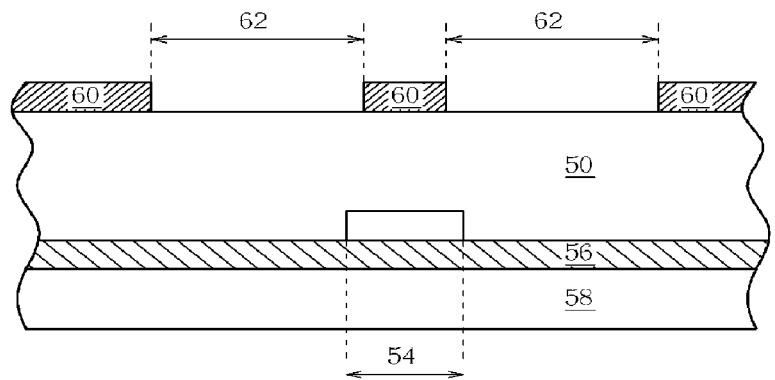

As shown in FIG. 6, the photo resist pattern (not shown) is stripped, and a bonding layer 56 is utilized to bond the bottom surface of the wafer 50 and a carrier 58 together. Afterward, another photo resist pattern 60 is formed on the top surface of the wafer 50 to define the dimensions of two through regions 62. In this embodiment, the material of the bonding layer 56 is selected from photo resist, metal, silicon oxide, benzocyclobutene (BCB), polyimide, tape, UV tape, wax, and so on, which can be easily removed by wet etching, heating, or irradiating. The carrier 58 is selected from materials compatible to semiconductor processes, such as silicon, glass, quartz, and ceramics.

Figure 7:
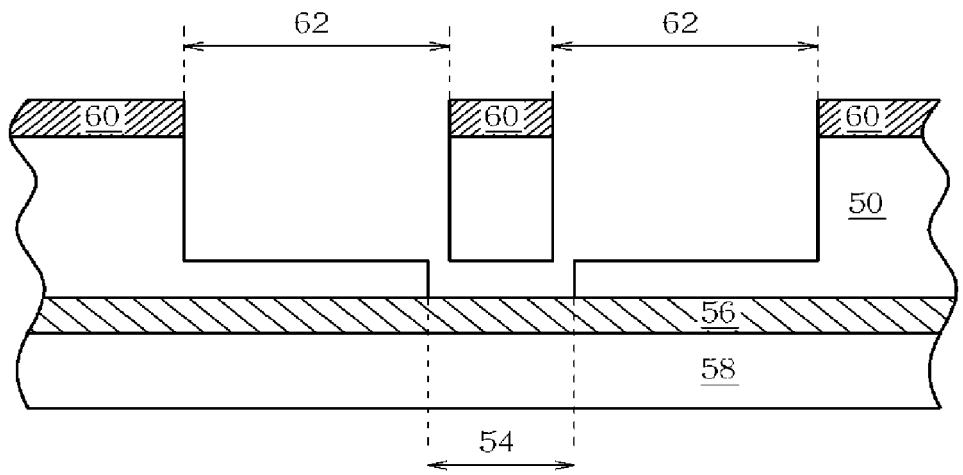

As shown in FIG. 7, another etching process, such as a RIE process, is performed to etch the wafer 50 unprotected by the photo resist pattern 60 in the through regions 62. It is noteworthy that when the etching process is performed down to the depth shown in FIG. 7, the wafer 50 in the spindle region 54 is suspended. Meanwhile, the variation of overall area being etched is equal to the area of the wafer 50 in the through regions 62 minus the area of the wafer in the spindle region 54, and thus the overall area is not dramatically varied. In addition, since the etching process does not reach the bonding layer 56, side etching effect will not occur. It is also appreciated that the dimension of the spindle region 54 is slightly larger than the actual dimension of the micro spindle to be formed for increasing alignment tolerance of the second etching process, so that the shape and size of the micro spindle is more accurate.

Figure 8:
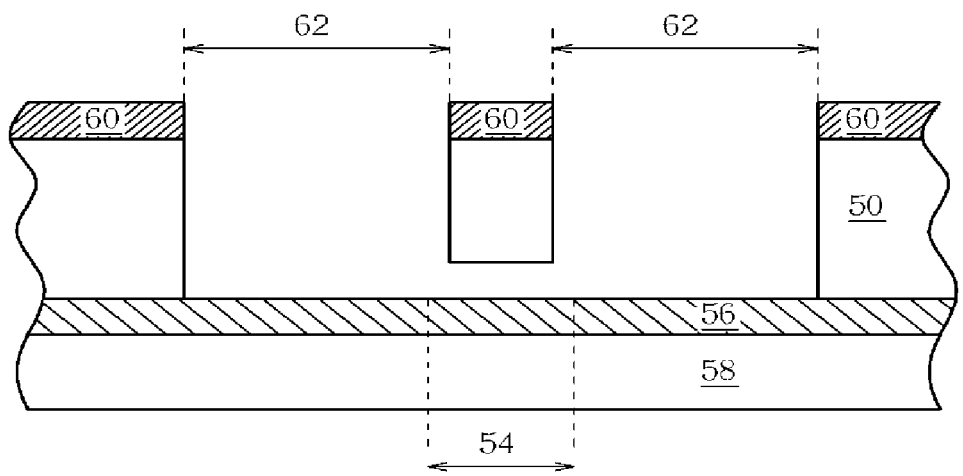

As shown in FIG. 8, the etching process is continued until etching through wafer 50 in the through regions. The photo resist pattern 60 on the top surface of the wafer 50 and the bonding layer 56 on the bottom surface of the wafer 50 are then removed for accomplishing fabrication of the micro spindle. The bonding layer 56 works to bond the wafer 50 and the carrier 58, and functions as an etching stop layer as well. When the etching process is performed down to the bonding layer 56, the overall area being etched varies extremely, and side etching may occur. However, the wafer 50 in the spindle region 54 is suspended, and the predetermined depth being etched in the first etching process takes the variations of the second etching process and the wafer 50 thickness into consideration in advance, and thus the wafer 50 in the spindle region 54 is not affected. Consequently, the structure of the micro spindle is ensured.

In comparison with prior art, the method of the present invention forms the micro spindle by means of double-sided etching, and thus is able to prevent excessive variation in overall area being etched and the side etching problem while the etching process is performed down to the etching stop layer. Consequently, the reliability and stress-bearing capability of the micro spindle is ensured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of double-sided etching, comprising:
    providing a wafer comprising at least a first region and at least a second region, an area of the first region being smaller than an area of the second region, and the second region being partially overlapped with the first region;
    performing a first etching process upon a first surface of the wafer to remove the wafer in the first region until a predetermined depth;
    bonding the first surface of the wafer to a carrier; and
    performing a second etching process upon a second surface of the wafer to remove a portion of the wafer in the second region not overlapped with the first region until the wafer is etched through.

2. The method of claim 1, wherein the first region and the second region define a micro spindle structure.

3. The method of claim 1, wherein the first etching process comprises:
    forming a first photo resist pattern exposing the first region on the first surface of the wafer;
    etching the wafer not covered by the first photo resist pattern until the predetermined depth, the predetermined depth being larger than a sum of a deviation of the second etching process and a deviation of a thickness of the wafer; and
    removing the first photo resist pattern.

4. The method of claim 1, wherein the first surface of the wafer is bonded to the carrier with a bonding layer.

5. The method of claim 1, wherein the second etching process comprises:
    forming a second photo resist pattern exposing the second region not overlapped with the first region;
    etching through the wafer not covered by the second photo resist pattern until the bonding layer; and
    removing the second photo resist pattern.

6. The method of claim 1, further comprising performing the step of removing the bonding layer after the second etching process.

7. A method of forming a micro spindle, comprising:
    providing a wafer comprising at least a spindle region and two through regions, the two through regions being respectively positioned on both sides of the spindle region;
    partially removing the wafer in the spindle region from a first surface of the wafer; and
    removing the wafer in the two through regions from a second surface of the wafer until the wafer is removed through to the first surface, wherein the first surface of the wafer is bonded to a carrier with a bonding layer while removing the wafer in the two through regions.

8. The method of claim 7, wherein the wafer in the spindle region is removed by etching.

9. The method of claim 7, wherein the wafer in the two through regions are removed by etching.

10. The method of claim 7, further comprising the step of removing the bonding layer after the wafer in the two through regions is removed.

* * * * *